(12) United States Patent
Ohno et al.

(10) Patent No.: US 11,171,572 B2
(45) Date of Patent: Nov. 9, 2021

(54) MICROWAVE-RECTIFYING CIRCUIT

(71) Applicant: Laser Systems Inc., Hokkaido (JP)

(72) Inventors: Yasuo Ohno, Kanagawa (JP); Hiroko Itoh, Hokkaido (JP)

(73) Assignee: LASER SYSTEMS INC., Hokkaido (JP)

( * ) Notice: Subject to any disclaimer, the term of this patent is extended or adjusted under 35 U.S.C. 154(b) by 0 days.

(21) Appl. No.: 16/642,478

(22) PCT Filed: Aug. 3, 2018

(86) PCT No.: PCT/JP2018/029157
§ 371 (c)(1),
(2) Date: Feb. 27, 2020

(87) PCT Pub. No.: WO2019/044377
PCT Pub. Date: Mar. 7, 2019

(65) Prior Publication Data
US 2020/0259423 A1   Aug. 13, 2020

(30) Foreign Application Priority Data
Aug. 30, 2017  (JP) .............................. JP2017-165792

(51) Int. Cl.
*H03H 7/18*     (2006.01)
*H02M 7/06*    (2006.01)

(52) U.S. Cl.
CPC ................ *H02M 7/06* (2013.01); *H03H 7/18* (2013.01)

(58) Field of Classification Search
CPC .................................. H02M 7/08; H03M 7/18
See application file for complete search history.

(56) References Cited

U.S. PATENT DOCUMENTS

| | | | | |
|---|---|---|---|---|
| 9,531,291 | B2* | 12/2016 | Perreault | H02M 7/217 |
| 9,749,017 | B2* | 8/2017 | Moshfeghi | H04B 7/0617 |
| 9,837,857 | B2* | 12/2017 | Fujiwara | H01Q 1/2225 |
| 9,979,240 | B2* | 5/2018 | Parks | H02J 50/20 |
| 2020/0044322 | A1* | 2/2020 | Lee | H01Q 9/42 |

FOREIGN PATENT DOCUMENTS

| | | |
|---|---|---|
| CN | 101013858 A | 8/2007 |
| JP | 2014-023069 A | 2/2012 |
| JP | 2012-023857 A | 2/2014 |

OTHER PUBLICATIONS

International Search Report from International Application No. PCT/JP2018/029157 dated Sep. 18, 2018.

* cited by examiner

*Primary Examiner* — Dinh T Le
(74) *Attorney, Agent, or Firm* — Brundidge & Stanger, P.C.

(57) ABSTRACT

A microwave-rectifying circuit for rectifying AC power is equipped with: an input line into which AC power is inputted; multiple branch lines which branch off from the branching point on the output side of the input line into n lines; rectifiers which rectify the AC power flowing through the branch lines and are positioned in each of the multiple branch lines; and phase shift units which are provided upstream from the rectifier in at least n−1 branch lines among the multiple branch lines, and shift the phase of the AC power in a manner such that relative to the AC power which flows through one branch line and arrives at the corresponding rectifier, the AC power which flows through each of the other n−1 branch lines and arrives at the corresponding rectifier exhibits a phase difference of k×180/n°.

4 Claims, 10 Drawing Sheets

| AMOUNT OF PHASE SHIFT [°] | C1,C2[pF] | L1[nH] |
|---|---|---|
| 30 | 0.147 | 0.686 |
| 36 | 0.178 | 0.805 |
| 45 | 0.228 | 0.972 |
| 60 | 0.317 | 1.188 |
| 67.5 | 0.367 | 1.268 |
| 72 | 0.399 | 1.305 |
| 90 | 0.549 | 1.372 |
| 108 | 0.757 | 1.304 |

MICROWAVE-RECTIFYING CIRCUIT

TECHNICAL FIELD

The present disclosure relates to a microwave-rectifying circuit.

BACKGROUND ART

A rectenna apparatus (rectifying antenna, also referred to as a rectifier antenna) that receives an electromagnetic wave in a microwave band at an antenna and rectifies and converts obtained high-frequency power to DC power (RF-DC conversion) is known (see, for example, Patent Literature (hereinafter abbreviated as PTL) 1 and PTL 2).

For a rectifying circuit (hereinafter referred to as "microwave-rectifying circuit") that is used in this type of rectenna apparatus, there is a demand for suppressing a reflected wave from within the microwave-rectifying circuit to the antenna side.

In general, in a circuit in which high-frequency power is used, a reflected wave is generated when the impedance differs at a connecting section between circuits. In a microwave-rectifying circuit, in a case where a reflected wave to the antenna side is generated, the reflected wave is re-radiated to an external space from the antenna, which causes an increase in power loss, and furthermore, adversely affects radio waves for other uses.

CITATION LIST

Patent Literature

PTL 1
Japanese Patent Application Laid-Open No. 2014-023069
PTL 2
Japanese Patent Application Laid-Open No. 2012-023857

SUMMARY OF INVENTION

Technical Problem

To solve the above-described problems, for example, PTL 1 describes a technique in which a harmonic rejection filter using an open stub and a matching circuit for fundamental waves are disposed upstream of a rectifying section formed of a rectifier diode.

The related art described in PTL 1 assumes that a reflected wave generated in the rectenna apparatus is constant. On the other hand, in actuality, the form of propagation of an electromagnetic wave significantly changes. As a result, the input power changes, and reflection properties in the rectifying section change due to nonlinearity of the rectifying circuit. In accordance with the change, parameters of the matching circuit for fundamental waves need to be changed. Therefore, when the related art in PTL 1 is applied to a mobile object or the like for which the radio-wave environment changes, it is difficult to suppress the reflected wave to the antenna side.

PTL 2 describes a technique in which microwave power is divided and input to two rectifying circuits and a line having a length of $\lambda/4$ is added to one of the two rectifying circuits so that reflected waves have phases opposite to each other and re-radiation from the reception antenna is suppressed. However, our analysis finds that this technique is not satisfactory, and a method for suppressing reflection under a condition in a wide range to attain a high RF/DF conversion efficiency exists.

The present disclosure has been made in view of the above-described problems, and an object thereof is to provide a microwave-rectifying circuit that can suppress re-radiation of a received microwave from the antenna to an external space even in a case where a radio-wave environment changes and reflection properties in the rectifying section change.

Solution to Problem

The present disclosure mainly solving the problems mentioned above provides a microwave-rectifying circuit that rectifies AC power, the microwave-rectifying circuit including:

an input line to which the AC power is input;

a plurality of branch lines that are n branch lines (where n is a positive integer equal to or larger than 3) branching from a branch point on an output side of the input line;

rectifying sections that are disposed in the plurality of branch lines respectively and rectify the AC power that flows through the plurality of branch lines; and phase shifting sections that are disposed upstream of the rectifying sections in at least (n−1) branch lines among the plurality of branch lines and shift a phase of the AC power in such a manner that, relative to the AC power that flows through one of the plurality of branch lines and arrives at a corresponding one of the rectifying sections, the AC power that flows through each of the other (n−1) branch lines and arrives at corresponding ones of the rectifying sections has a phase difference that differs by $k \times 180/n°$ (where k is a positive integer from 1 to n−1).

Advantageous Effects of Invention

With the microwave-rectifying circuit according to the present disclosure, it is possible to suppress re-radiation of a received microwave from the antenna to an external space and to maintain the RF/DC conversion efficiency at a high level.

DESCRIPTION OF EMBODIMENTS

Figure 1:
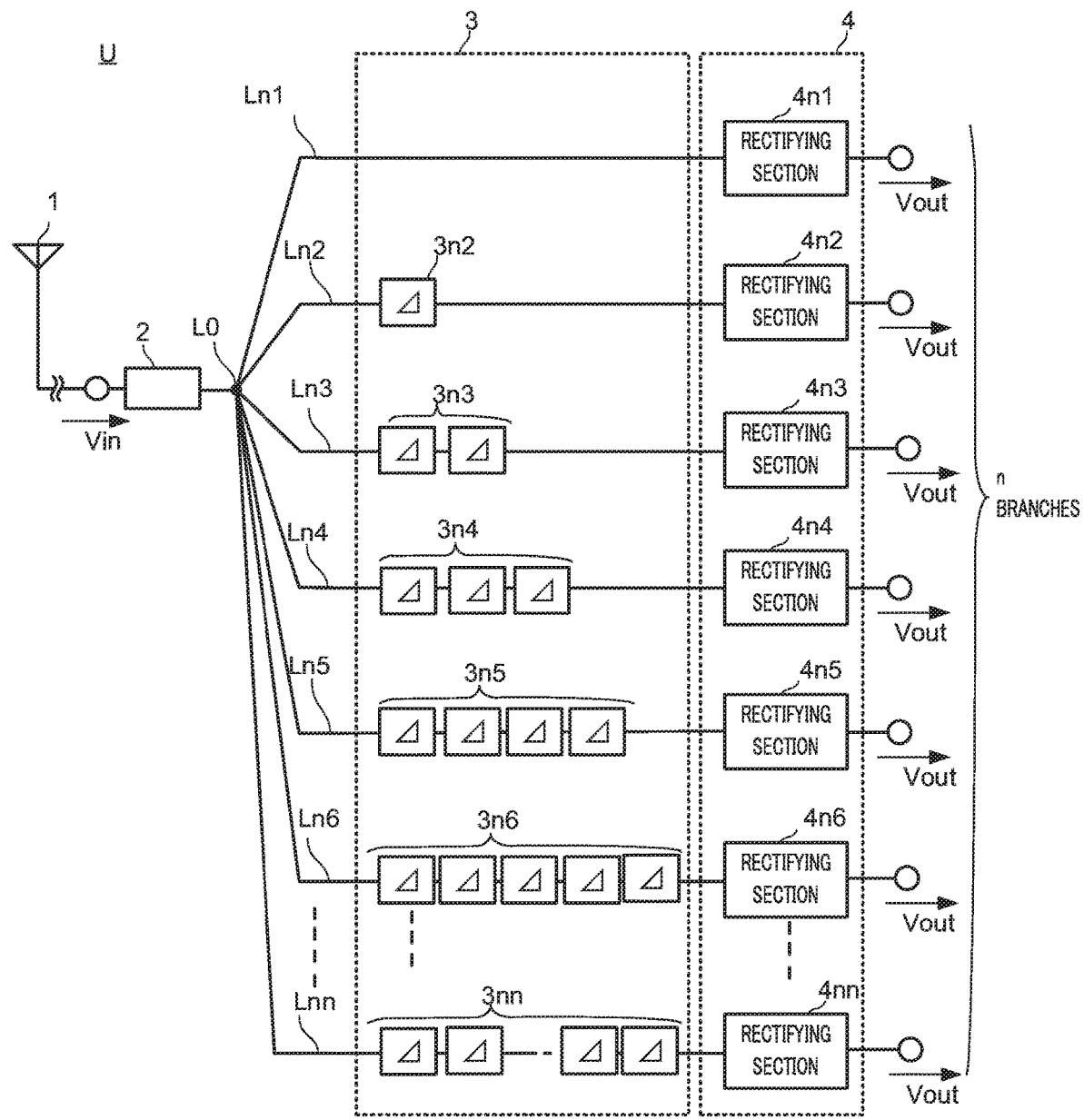
FIG. 1 is a diagram illustrating an example configuration of a microwave-rectifying circuit according to Embodiment 1.

Hereinafter, preferred embodiments of the present disclosure will be described in detail with reference to the accompanying drawings. Note that elements having substantially the same functional configurations are assigned the same reference numerals in the description and drawings, and duplicated descriptions thereof are omitted.

Embodiment 1

[Configuration of Microwave-Rectifying Circuit]

An example configuration of microwave-rectifying circuit U according to Embodiment 1 will be described below with reference to FIG. 1. Microwave-rectifying circuit U according to this embodiment is applied to, for example, the rectenna apparatus described above.

FIG. 1 is a diagram illustrating an example configuration of microwave-rectifying circuit U according to this embodiment.

Microwave-rectifying circuit U according to this embodiment includes input line 2, phase shifting section 3, and rectifying section 4.

To input line 2, high-frequency power (hereinafter also referred to as "input wave Vin") received from antenna 1 is input. To the output side of input line 2, n branch lines Ln1, Ln2, ..., Lnn (where n is a positive integer equal to or larger than 3) branching from branch point L0 are connected. Input wave Vin input to input line 2 branches into the plurality of branch lines Ln1, Ln2, ..., Lnn from branch point L0 and travels downstream.

Desirably, the number of branch lines Ln1, Ln2, ..., Lnn is set to a large number as much as possible so that multiple-reflection components cancel each other out at branch point L0, and is set to at least three or more.

In the following description, in a case of indicating a specific branch line among n branch lines Ln1, Ln2, ..., Lnn, the j-th (j≤n) branch line from the upper side of FIG. 1 is referred to as "branch line Lnj". The j-th (j≤n) configuration from the upper side of FIG. 1 is referred to as "phase shifting section 3nj", "rectifying section 4nj", etc. in the description.

Phase shifting section 3 is disposed in at least (n−1) branch lines among n branch lines Ln1, Ln2, ..., Lnn between branch point L0 and rectifying section 4 and shifts the phase of the high-frequency power (input wave Vin and reflected waves) passing therethrough so that combined fundamental components of the reflected waves generated in rectifying section 4 become zero at branch point L0.

Phase shifting section 3 according to this embodiment shifts the phase of the high-frequency power in such a manner that, relative to the high-frequency power that flows through one branch line, namely, branch line Ln1, and arrives at rectifying section 4n1, the high-frequency power that flows through each of the other (n−1) branch lines Ln2, Ln2, Ln3, ..., Lnn and arrives at rectifying sections 4n2, 4n3, ..., 4nn has a phase difference that differs by k×180/n° (where k is a positive integer from 1 to n−1).

Specifically, when the amount of phase shift for branch line Ln1 is 0° in phase shifting section 3, phase shifting section 3n2 shifts the phase of the high-frequency power that passes therethrough by 180/n°, phase shifting section 3n3 shifts the phase of the high-frequency power that passes therethrough by 2×180/n°, phase shifting section 3n4 shifts the phase of the high-frequency power that passes therethrough by 3×180/n°, and phase shifting section 3nn shifts the phase of the high-frequency power that passes therethrough by (n−1)×180/n°.

Phase shifting section 3 is formed of, for example, line length adjusting sections 3n2, ..., 3nn respectively provided in the plurality of branch lines Ln2, ..., Lnn and adjusts the amounts of phase shift on the basis of the lengths of the transmission lines of the plurality of branch lines Ln1, ..., Lnn up to respective rectifying sections 4n1, ..., 4nn. However, phase shifting section 3 is not limited to this and can be implemented by using lumped constant circuits, such as π circuits. The direction of phase shifting by phase shifting section 3 may be the phase-lag direction or the phase-lead direction.

Accordingly, combined reflected waves generated in rectifying sections 4n1, ..., 4nn become zero at branch point L0. Therefore, combined components of reflected waves that are, for example, re-reflected at branch point L0 can be made closer to zero (the details will be described below).

Rectifying section 4 is disposed downstream of phase shifting section 3 for each of the plurality of branch lines Ln1, ..., Lnn to rectify input wave Vin. Rectifying section 4 is formed by using diodes and is formed of, for example, single-shunt rectifying circuits or voltage doubler rectifying circuits.

Rectifying sections 4n1, ..., 4nn respectively disposed in the plurality of branch lines Ln1, ..., Lnn are configured to have the same reflection properties. In rectifying sections 4n1, ..., 4nn, for example, diodes having the same properties and circuit configurations of the same type are used. Accordingly, reflected waves respectively generated in rectifying sections 4n1, ..., 4nn have substantially the same waveforms.

Rectifying sections 4n1, ..., 4nn each generate DC power, which is output to a downstream collector section (not illustrated) and combined at the collector section. In this case, to keep the properties of rectifying sections 4 the same, the output voltages of respective rectifying sections 4 need to be the same, and it is important to short-circuit rectifying sections 4 at the collector section.

Branch lines Ln1, ..., Lnn are connected to branch point L0 so that the impedance matching with input line 2 is attained at branch point L0. In other words, the circuit constants of rectifying section 4 and phase shifting section 3 disposed in each of branch lines Ln1, ..., Lnn are set so that branch lines Ln1, ..., Lnn and input line 2 attain impedance matching at branch point L0. In each of branch lines Ln1, ..., Lnn, a λ/4 line or the like for performing impedance matching between branch point L0 and phase shifting section 3 may be provided.

[Operations of Microwave-Rectifying Circuit]

The operations of microwave-rectifying circuit U according to this embodiment will be described below with reference to FIG. 2 to FIG. 4.

Figure 2:
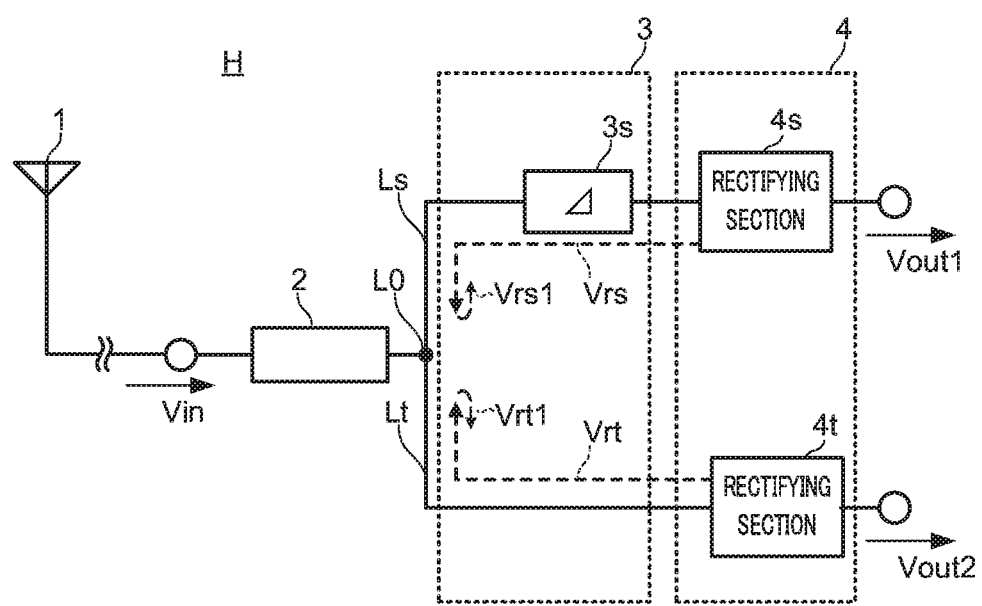
FIG. 2 is a diagram illustrating a configuration of a microwave-rectifying circuit according to a comparative example.

FIG. 2 is a diagram illustrating a configuration of microwave-rectifying circuit H according to a comparative example.

First, with reference to microwave-rectifying circuit H according to the comparative example, an effect of reflected waves canceling each other out by bifurcating into two branch lines Ls and Lt from branch point L0 on the output side of input line 2 and providing phase shifting section 3 in two branch lines Ls and Lt is described.

Microwave-rectifying circuit H according to the comparative example has branch line Ls on one side and branch line Lt on the other side, which bifurcate from branch point L0 of input line 2. Branch line Ls on the one side is configured such that rectifying section 4s is disposed with phase shifting section 3s shifting a phase by 90 degrees interposed between branch point L0 and rectifying section 4s. Branch line Lt on the other side is configured such that rectifying section 4t is directly connected to branch point L0.

In microwave-rectifying circuit H according to the comparative example, when input wave Vin is input to input line 2, first, a reflected wave (indicated by Vrs in FIG. 2) is generated in rectifying section 4s on the one side, and a reflected wave (indicated by Vrt in FIG. 2) is also generated in rectifying section 4t on the other side.

Reflected wave Vrs on the one side and reflected wave Vrt on the other side have the same waveforms because the reflection properties of rectifying section 4s and the reflection properties of rectifying section 4t are the same. Input wave Vin is input via phase shifting section 3s on the one side, and therefore, reflected wave Vrs on the one side has a phase difference of 90° at the time of arrival at rectifying section 4 relative to reflected wave Vrt on the other side.

Reflected wave Vrs on the one side passes through phase shifting section 3s again and arrives at branch point L0. Reflected wave Vrt on the other side arrives at branch point L0 as is. Therefore, at branch point L0, reflected wave Vrs on the one side has a phase difference of 180° relative to reflected wave Vrt on the other side. That is, at branch point L0, reflected wave Vrs on the one side and reflected wave Vrt on the other side have the same waveforms and have phases opposite to each other. Accordingly, reflected wave Vrs on the one side and reflected wave Vrt on the other side cancel each other out when traveling from branch point L0 toward input line 2.

As described above, in microwave-rectifying circuit H according to the comparative example, rectifying section 4s and rectifying section 4t to which input wave Vin is branched and input are disposed, and phase shifting section 3s is disposed upstream of rectifying section 4s or rectifying section 4t. As a result, the effect of reflected waves (reflected wave Vrs and reflected wave Vrt) canceling each other out can be expected.

However, microwave-rectifying circuit H according to the comparative example has a problem, that is, it is not possible to suppress re-radiation caused by multiple reflection.

Specifically, reflected wave Vrs on the one side returning to branch point L0 does not return to input line 2 in whole, and part thereof is re-reflected to branch line Ls from which reflected wave Vrs has arrived (indicated by Vrs1 in FIG. 2). Similarly, part of reflected wave Vrt on the other side returning to branch point L0 is re-reflected to branch line Lt from which reflected wave Vrt has arrived (indicated by Vrt1 in FIG. 2).

Reflected waves Vrs1 and Vrt1 that are, for example, re-reflected at branch point L0 are respectively reflected at rectifying section 4s and rectifying section 4t and return to branch point L0 again. When re-reflected wave Vrs1 and re-reflected wave Vrt1 return to branch point L0 again, the phases thereof match. As a result, reflected waves Vrs1 and Vrt1 travel toward the antenna 1 side through input line 2 without canceling each other out and are re-radiated from antenna 1.

In view of the above-described issue, in microwave-rectifying circuit U according to this embodiment, the number of branch lines Ln1, ..., Lnn is set to three or more so that, when the reflected waves that are, for example, re-reflected (hereinafter also referred to as multiple-reflection components) return to branch point L0 again, the combined components become closer to zero, and phase shifting section 3 shifts the phase of the high-frequency power that flows through each of branch lines Ln1, ..., Lnn by 180/n°.

Figure 3:
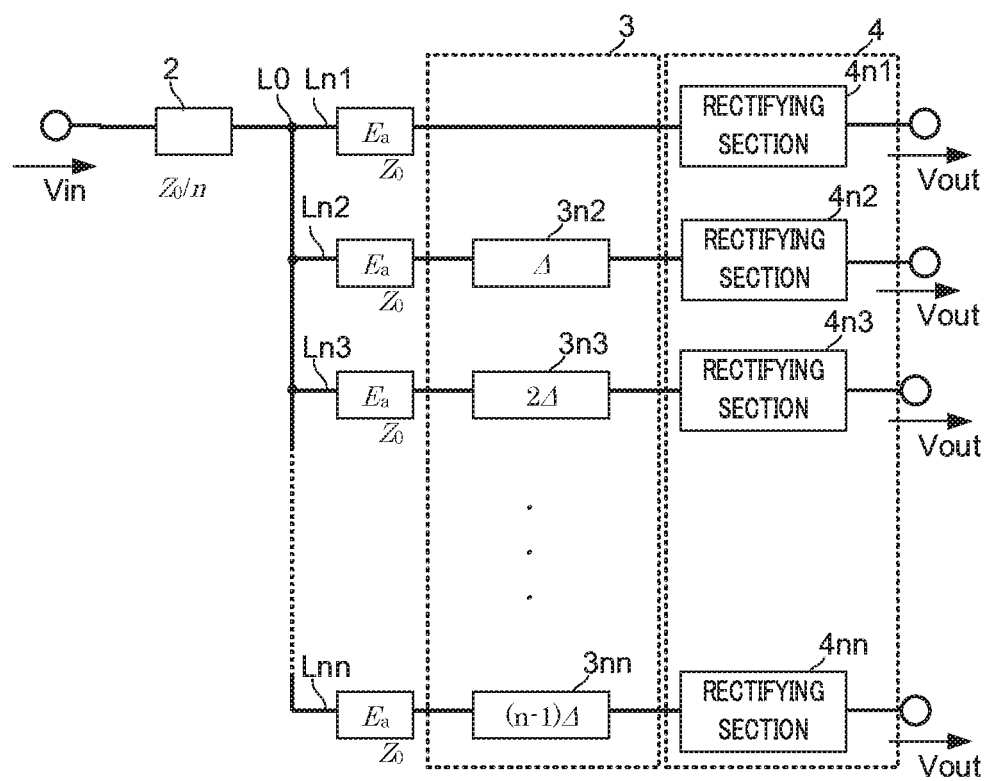
FIG. 3 is a diagram illustrating example circuit constants of the configuration of the microwave-rectifying circuit according to Embodiment 1.

Now, with reference to FIG. 3, the behavior of the voltage at branch point L0 of microwave-rectifying circuit U according to this embodiment is described.

FIG. 3 is a diagram illustrating example circuit constants of microwave-rectifying circuit U according to this embodiment.

First, the behavior of the voltage at branch point L0 is described without taking into consideration multiple reflection. In microwave-rectifying circuit U according to this embodiment, to perform impedance matching at branch point L0, when the characteristic impedance of input line 2 is $Z_0/n$, the characteristic impedance of each of branch lines Ln1, ..., Lnn is $Z_0$. Impedance matching is established between input line 2 and branch lines Ln1, ..., Lnn, and therefore, the input wave is equally divided among branch lines Ln1, ..., Lnn and travels. At this time, the voltage waveform $F_0(t)$ at branch point L0 is a waveform the same as a waveform $A \sin \omega t$ of the input wave that travels through each of branch lines Ln1, ..., Lnn, and $F_0(t) = A \sin \omega t$ holds. When the power of the waveform in input line 2 is "1", the power of the waveform in each of branch lines Ln1, ..., Lnn is "1/n", and the total power is "1", which is equal to the power on the input side.

In branch lines Ln1, ..., Lnn, attaching sections having the same electrical length $E_a$ are usually provided, and rectifying circuits 4n1, ..., 4nn having the same properties are provided at the end. Phase shifting section 3 are disposed between the attaching sections and rectifying circuits 4n1, ..., 4nn, and increases the amount of phase shift by Δ in such a manner that, for example, phase shifting section 3 sets the amount of phase shift for branch line Ln1 to zero, sets the amount of phase shift for branch line Ln2 to Δ, sets the amount of phase shift for branch line Ln3 to 2Δ, and sets the amounts of phase shift for the subsequent branch lines in a similar manner so that the amount of phase shift for the j-th branch line Lnj is (j−1)Δ (where Δ=180/n°).

The input wave branching into branch lines Ln1, ..., Lnn is subjected to the same reflection at rectifying sections 4n1, ..., 4nn provided at the end. The reflection coefficient is represented by r, where r is generally a complex number for which the absolute value is 1 or less. When the input wave that travels through branch line Ln1 returns to branch point L0 again as a reflected wave, a delay corresponding to reflection at rectifying section 4n1 for one time and traveling of electrical length $E_a$ for two times occurs. In the j-th branch line Lnj (where j≤n), a delay in phase shifting section 3nj is further added, and the reflected wave is subjected to a delay corresponding to reflection for one time and $2E_a+2(j−1)\Delta$ and returns to branch point L0. Therefore, when the input wave that travels through branch line Lnj returns to branch point L0 again as a reflected wave, the waveform of the reflected wave is expressed by $Ar \sin(\omega t + 2E_a + 2(j−1)\Delta)$.

Therefore, the voltage $F_1(t)$ at branch point L0 is expressed by following equation 1 from the sum of the reflected waves in branch lines Ln1, ..., Lnn.

[1]
$$F_1(t) = \frac{1}{n}\Sigma_1^n \ Ar \ \sin(\omega t + 2E_a + 2(j-1)\Delta) \quad (1)$$
$$= A\frac{r}{n}\frac{\sin n\Delta \cdot \sin(\omega t + (n-1)\Delta)}{\sin \Delta}$$

Here, because of Δ=180/n°, sin nΔ=0 holds. That is, taking into consideration only reflected waves reflected once, the voltage at branch point L0 is $F_1(t)$=0 as in the microwave-rectifying circuit (FIG. 2) described in the comparative example. In equation 1, division by n is done because the impedance at branch point L0 is $Z_0$/n while the characteristic impedance in branch lines Ln1, . . . , Lnn is $Z_0$.

Next, the behavior of the voltage at branch point L0 in a case where multiple reflection is taken into consideration is described.

Here, a state where the voltage at branch point L0 is zero regardless of the time is equivalent to a state where branch point L0 is short-circuited to a ground terminal, and the phase of a reflected wave is reversed by 180° at branch point L0, and the reflected wave returns to a path from which the reflected wave has arrived. At this time, reflected waves returning to branch point L0 from branch lines Ln1, . . . , Lnn return again to branch lines Ln1, . . . , Lnn from which the reflected waves have arrived to the substantially same degree. Here, the waveform of a reflected wave in the j-th branch line Lnj is expressed by Ar sin(ωt+π+2$E_a$+2(j−1)Δ). This reflected wave travels to the rectifying section 4 side, is re-reflected at rectifying section 4, is subjected to a delay of 2$E_a$+2(j−1)Δ, and returns to branch point L0 again. Such reflection is repeated multiple times between branch point L0 and rectifying sections 4n1, . . . , 4nn in branch lines Ln1, . . . , Lnn.

Therefore, the waveform of the reflected wave returning to branch point L0 for the p-th time through the j-th branch line Lnj is expressed by $Ar^p$ sin(ωt+pπ+2$E_a$+2(j−1)Δ). As a result, the total voltage $F_p(t)$ at branch point L0 after reflection for p times is expressed by following equation 2.

[2]
$$F_p(t) = \frac{1}{n}\Sigma_1^n \ Ar^p \ \sin(\omega t + p\pi + 2pE_a + 2p(j-1)\Delta) \quad (2)$$
$$= A\frac{r^p}{n}\frac{\sin np\Delta \cdot \sin(\omega t + p\pi + p(n-1)\Delta)}{\sin p\Delta}$$
$$= A\frac{r^p}{n}\frac{\sin p\pi \cdot \left(\omega t + p\pi + p\left(\frac{n-1}{n}\right)\pi\right)}{\sin \pi p/n}$$
$$= A\frac{r^p}{n}\frac{\sin p\pi \cdot \sin\left(\omega t + 2p\pi - \frac{\pi}{n}\right)}{\sin \pi p/n}$$

Here, if p<n holds, the term of sin pπ on the right side is equal to zero, and the voltage at branch point L0 is $F_p(t)$=0. The reflected wave reflected p times is reflected at a short-circuit point similarly to the reflected wave reflected for the first time and returns to the branch line from which the reflected wave has arrived with the phase reversed. However, in the n-th reflection (which indicates a value equal to the number of the branch lines), p=n holds, and therefore, the denominator becomes zero in equation 2. When equation 2 is recalculated while p=n is assumed, the total voltage $F_n(t)$, at branch point L0, of the reflected waves reflected n times is expressed by following equation 3.

$$F_n(t) = \frac{1}{n}\Sigma_1^n \ Ar^n \ \sin(\omega t + n\pi + 2nE_a + 2n(j-1)\Delta) \quad (3)$$
$$= \frac{1}{n}\Sigma_1^n \ Ar^n \ \sin(\omega t + n\pi + 2nE_a + 2(j-1)\pi)$$
$$= \frac{1}{n}\Sigma_1^n \ Ar^n \ \sin(\omega t + n\pi + 2nE_a)$$
$$= Ar^n \ \sin(\omega t + n\pi + 2nE_a)$$

Therefore, in the case where multiple reflection is taken into consideration, the voltage $F_n(t)$ at branch point L0 is expressed by equation 3. The voltage $F_n(t)$ in equation 3 represents the voltage of the reflected waves that return to the input line 2 side from branch point L0. Therefore, the reflectance η when seen from the input line 2 side (which represents the proportion of the reflected waves that return to the input line 2 side when the input wave is input to input line 2, hereinafter referred to as "total reflectance η") is expressed by following equation 4 where only combined components of the reflected waves reflected n times need to be taken into consideration.

[4]
$$\eta = \frac{|F_n(t)|}{|F_0(t)|} \quad (4)$$
$$= r^n$$

As indicated by equation 4, the total reflectance η is equal to r to the power of n and r<1 holds. Therefore, it is found that, as the number of branch lines Ln1, . . . , Lnn, namely, n, increases, attenuation is larger. That is, in microwave-rectifying circuit U according to this embodiment, also multiple-reflection components can be attenuated.

Figure 4:
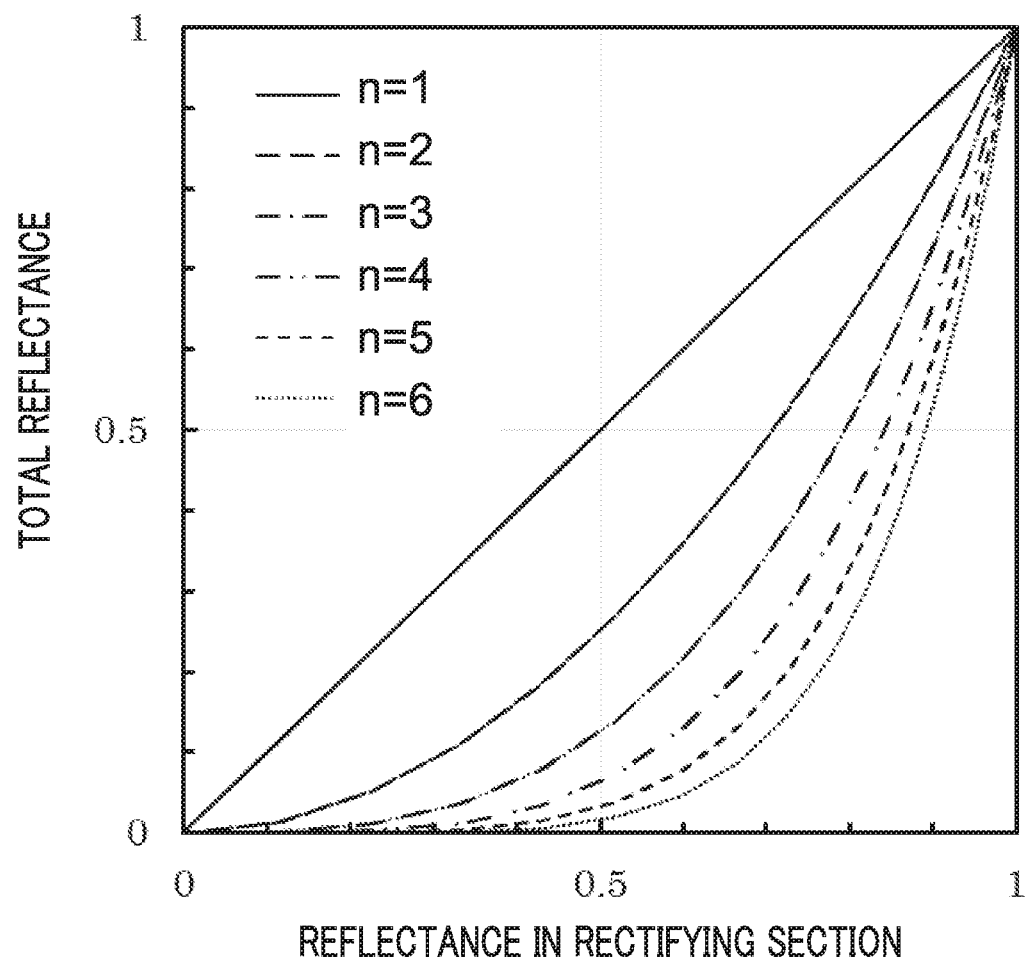
FIG. 4 is a diagram illustrating relations of a total reflectance based on the number of branches.

FIG. 4 is a diagram illustrating the total reflectance η based on the n-phase branches in microwave-rectifying circuit U according to this embodiment.

FIG. 4 illustrates the results of simulation indicating changes in the total reflectance η in a case where the reflectance of each rectifying section 4 is changed in the microwave-rectifying circuit illustrated in FIG. 3. In this simulation, a resistor is placed in each rectifying section 4 and the resistance is changed to thereby change the reflectance of each rectifying section 4. In FIG. 4, the horizontal axis represents the reflectance of each rectifying section 4, and the vertical axis represents the total reflectance η.

In order to indicate relations between the number of branches n (the number of branch lines Lnn) and the total reflectance η, FIG. 4 illustrates the results of simulation when the number of branches n (the number of branch lines Lnn) is changed. In FIG. 4, the graph for n=1 represents the total reflectance η in a case where the number of branch lines is one (no branch), the graph for n=2 represents the total reflectance η in a case where the number of branch lines is two, the graph for n=3 represents the total reflectance η in a case where the number of branch lines is three, the graph for n=4 represents the total reflectance η in a case where the number of branch lines is four, the graph for n=5 represents the total reflectance η in a case where the number of branch lines is five, and the graph for n=6 represents the total reflectance η in a case where the number of branch lines is six.

In the case where the number of branch lines is one, the reflected wave returns after reflected once, and therefore, the total reflectance η is equal to the reflectance of rectifying section 4. As found from FIG. 4, as the number of branches n increases, the reflectance decreases. The magnitude of the change numerically matches a result estimated from equation 4.

PTL 2 describes only a state where, when a phase difference of 90° is applied between the two branch lines, the phase difference between the reflected waves is 180° and the reflected waves cancel each other out. However, as analyzed herein, in microwave-rectifying circuit U according to this embodiment, with the n branches, only multiple-reflection components for the n-th time return to the input line 2 side. Therefore, it is found that the total reflectance η is reduced to the reflectance r for one time to the power of n (=$r^n$). In other words, as the number of branches n is increased, re-radiation from antenna 1 can be suppressed.

(Verification of Operations)

Now, the results of simulation performed for verifying operations of microwave-rectifying circuit U according to this embodiment will be described with reference to FIG. 5 to FIG. 7.

In this simulation, input wave Vin is input to a simulation circuit similar to microwave-rectifying circuit U illustrated in FIG. 1, the input power of input wave Vin is changed, and the reflected waves are calculated.

Figure 6:
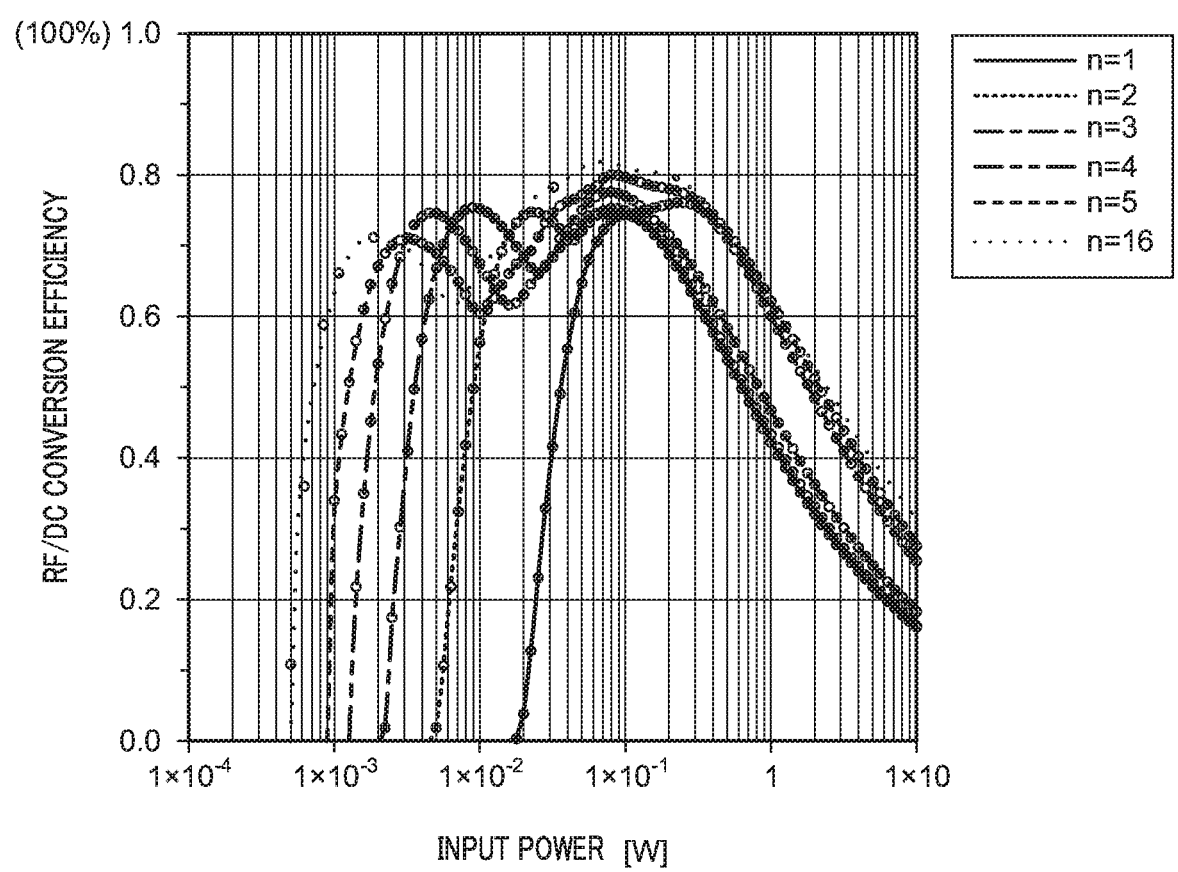
FIG. 6 is a diagram illustrating the results of circuit simulation of the microwave-rectifying circuit according to Embodiment 1.
Figure 7:
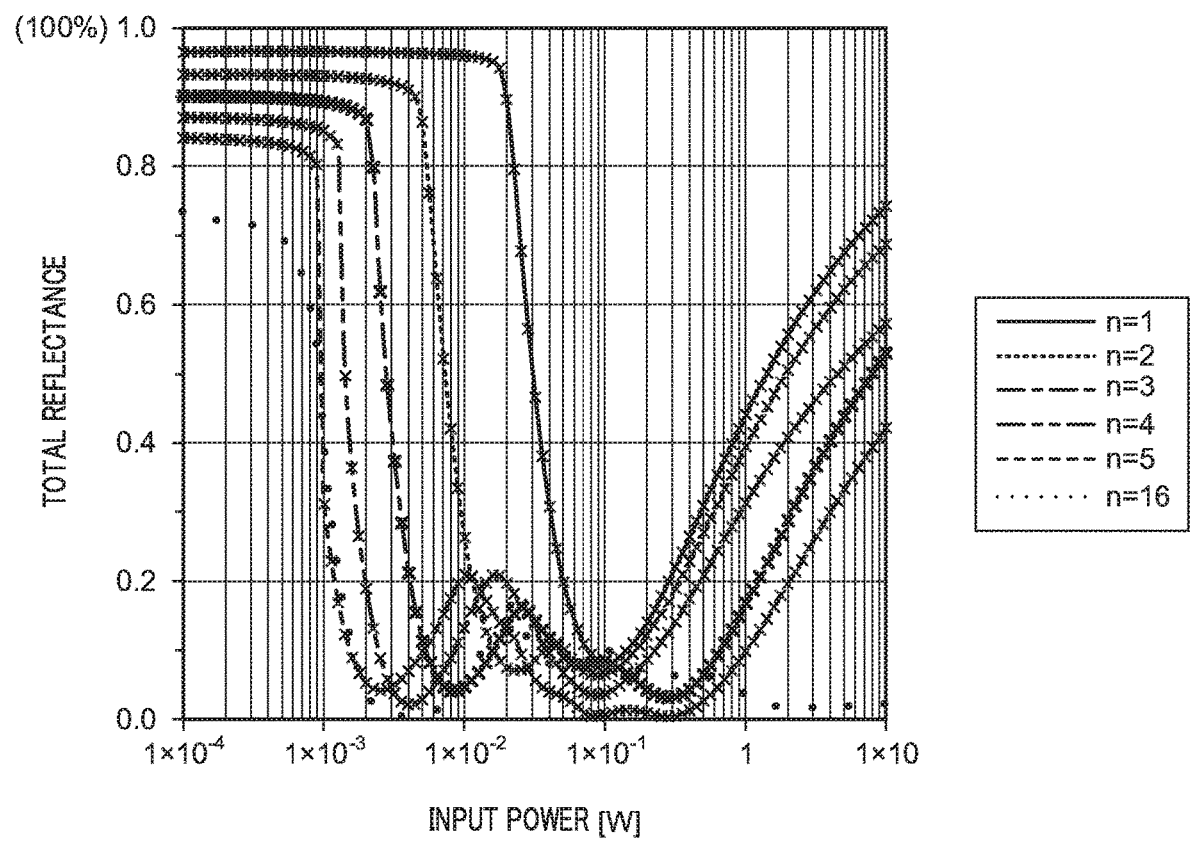
FIG. 7 is a diagram illustrating the results of circuit simulation of the microwave-rectifying circuit according to Embodiment 1.

FIG. 6 and FIG. 7 are diagrams illustrating the results of simulation. FIG. 6 indicates the RF/DC conversion efficiency, and FIG. 7 indicates the total reflectance (the proportion of the input wave that returns to input line 2 as a reflected wave).

In this circuit simulation, the RF/DC conversion efficiency and the total reflectance in a case where the number of branch lines of microwave-rectifying circuit U illustrated in FIG. 1 is changed are calculated.

The graphs in FIG. 6 and FIG. 7 each represent the results of simulation of the following microwave-rectifying circuit. In FIG. 6 and FIG. 7, the graph for n=1 represents a form in which the number of branches is one (no branch), the graph for n=2 represents a form in which the number of branches is two, the graph for n=3 represents a form in which the number of branches is three, the graph for n=4 represents a form in which the number of branches is four, the graph for n=5 represents a form in which the number of branches is five, and the graph for n=16 represents a form in which the number of branches is 16.

As described above, the amount of phase shift by phase shifting section 3 is set so as to shift the phase of the high-frequency power in such a manner that, relative to the high-frequency power that flows through one branch line, namely, branch line Ln1, and arrives at rectifying section 4n1, the high-frequency power that passes through each of the other (n−1) branch lines Ln2, Ln2, Ln3, . . . , Lnn and arrives at rectifying sections 4n2, 4n3, . . . , 4nn has a phase difference that differs by k×180/n° (where k is a positive integer from 1 to n−1).

That is, phase shifting section 3 shifts the phase of the high-frequency power that is input to each of branch lines Ln1, Ln2, Ln3, . . . , Lnn by 180/n° (by 90° in a case of two branches, by 60° in a case of three branches, by 45° in a case of four branches, by 36° in a case of five branches, and by 11.25° in a case of 16 branches).

Figure 5:
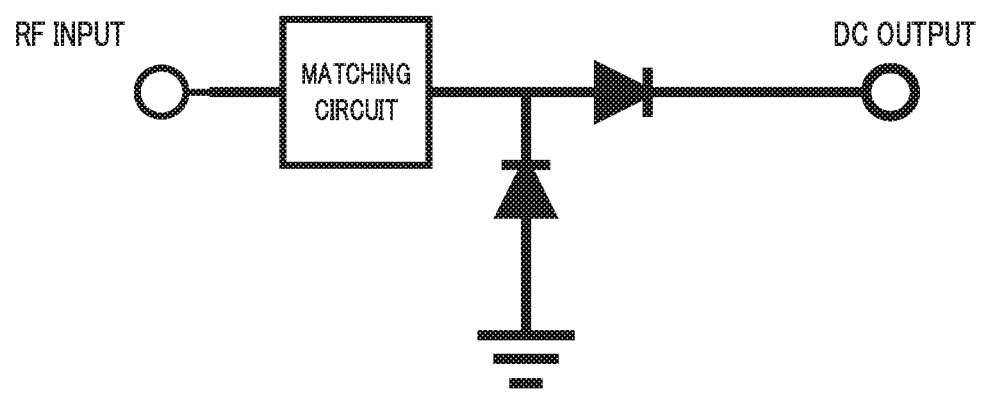
FIG. 5 is a diagram illustrating the details of a circuit used in circuit simulation.

FIG. 5 illustrates a configuration of rectifying section 4 used in the circuit simulation and illustrates a voltage doubler circuit, which is one type of microwave rectenna circuit. As the other conditions of the circuit simulation, circuit parameters extracted from a Schottky diode (SBD) formed of GaN are used. Six diodes having an anode diameter of 4 μmΦ constitute one diode in the circuit diagram. For one dot, the on-resistance is set to 26Ω, the junction capacitance is set to 0.03 pF, and the withstand voltage is set to 40 V. As calculation conditions, the output voltage is fixed to 10 V, and the input power in a case of one circuit with no branch is changed from 1 mW to 100 W at 5.8 GHz. The characteristic impedance of the signal source and the input line is set to 50Ω. The characteristic impedance of the branch lines is also set to 50Ω, and a λ/4 transformer is placed on the input line side for matching at point L0. The matching circuit illustrated in FIG. 5 is set so that reflection is minimized with a single voltage doubler in a case of Pin=1 W.

Referring to FIG. 6 and FIG. 7, the reflectance decreases on the high-power side (with reference to an input power of 1 W at which reflection at rectifying section 4 is minimized) while the RF/DC conversion efficiency increases. On the low-power side (with reference to an input power of 1 W at which reflection at rectifying section 4 is minimized), the lower limit of power at which the reflectance is 1 extends to a lower-power side as the number of branches n increases.

This is considered to be attributable also to an event different from the event where the total reflectance η decreases in power of n. The reflectance does not become 1 because the input power is low and the rectifier diodes are not turned on. An increase in reflectance in rectifying section 4 accelerates the tendency. However, it is considered that, when multiple reflection is repeated in multiple branches, a condition where matching can be attained is created, reflection is suppressed accordingly, and positive feedback that changes the situation of the diodes occurs.

Accordingly, in microwave-rectifying circuit U according to this embodiment, when the number of branches n (the number of branch lines Ln1, . . . , Lnn) is increased, the total reflectance η can be reduced, and the occurrence of a state where the reflectance r of rectifying section 4 is close to 1 is reduced. As a result, the RF/DC conversion efficiency can be increased.

As described above, with microwave-rectifying circuit U according to this embodiment, it is possible to suppress re-radiation of a received microwave from the antenna to an external space and to maintain the RF/DC conversion efficiency at a high level.

Embodiment 2

Now, microwave-rectifying circuit U according to Embodiment 2 will be described with reference to FIG. 8 to FIG. 11. Microwave-rectifying circuit U according to this embodiment is different from that of Embodiment 1 in that phase shifting section 3 is constituted by lumped constant circuits. For the configuration common to Embodiment 1, a description thereof is omitted.

Figures 8, 9:
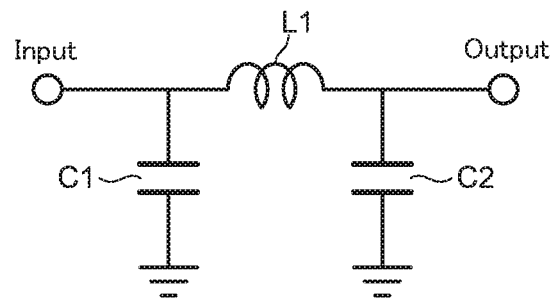
FIG. 8 is a diagram illustrating an example configuration of the microwave-rectifying circuit according to Embodiment 2.
FIG. 9 is a diagram illustrating example relations between circuit parameters of circuit elements of a lumped constant circuit and the amount of phase shift.

FIG. 8 is a diagram illustrating an example configuration of phase shifting section 3 according to Embodiment 2.

In microwave-rectifying circuit U according to this embodiment, each of phase shifting sections 3n2, . . . , 3nn is constituted by a π circuit.

The π circuit includes inductance element L1, first capacitor C1, and second capacitor C2. When the inductance of inductance element L1, the capacitance of first capacitor C1, and the capacitance of second capacitor C2 are set as appropriate, the π circuit can adjust the amount of phase shift of high-frequency power that passes therethrough.

FIG. 9 is a diagram illustrating example relations between the circuit parameters of the circuit elements of the π circuit (the inductor of inductance element L1 and the capacitance of first capacitor C1 and second capacitor C2) and the amount of phase shift. In FIG. 9, the amount of phase shift in a case of high-frequency power of 5.8 GHz is indicated.

In phase shifting section 3 according to this embodiment, the π circuit is provided in each branch line branching from branch point L0. The circuit parameters of the circuit elements of the π circuit are adjusted for each of branch lines Ln1, . . . , Lnn, as illustrated in FIG. 9, to thereby adjust the amount of phase shift. The amount of phase shift for each of branch lines Ln1, . . . , Lnn is as described in Embodiment 1.

Figure 10:
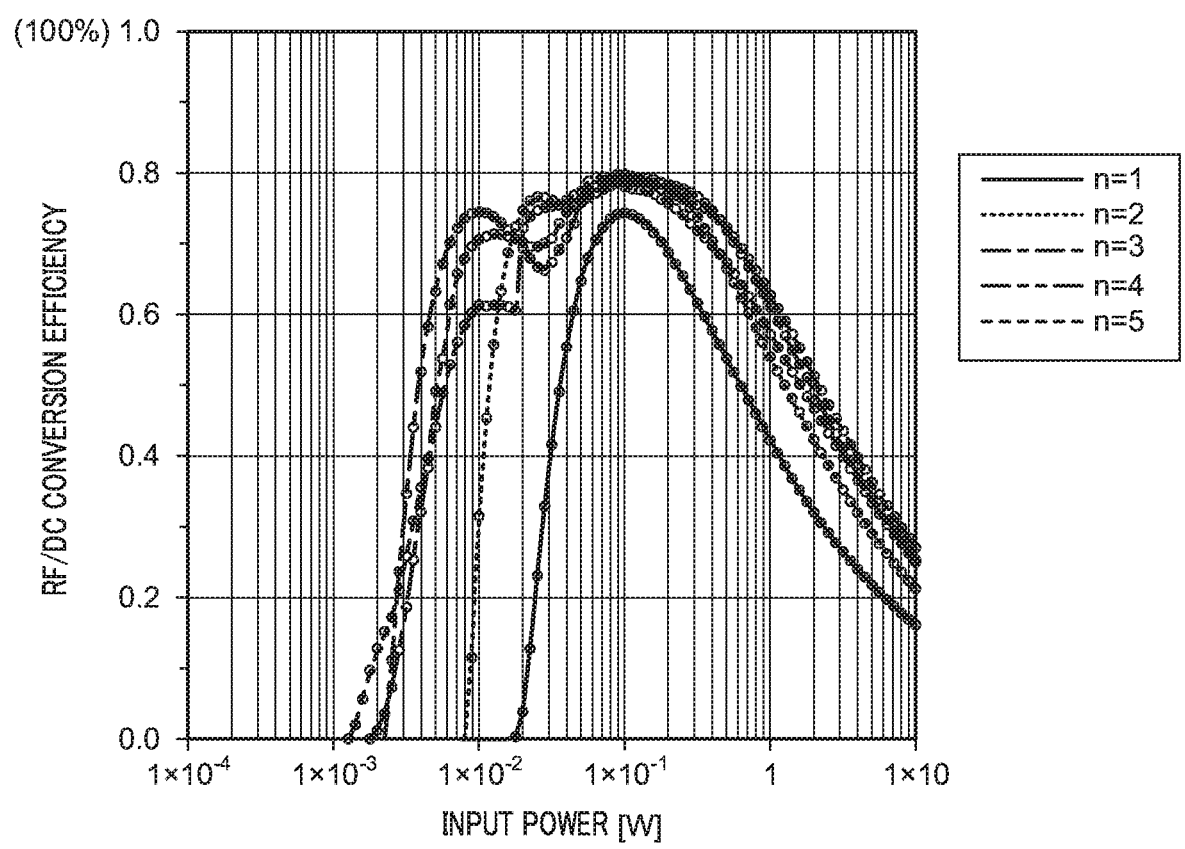
FIG. 10 is a diagram illustrating the results of circuit simulation of the microwave-rectifying circuit according to Embodiment 2.
Figure 11:
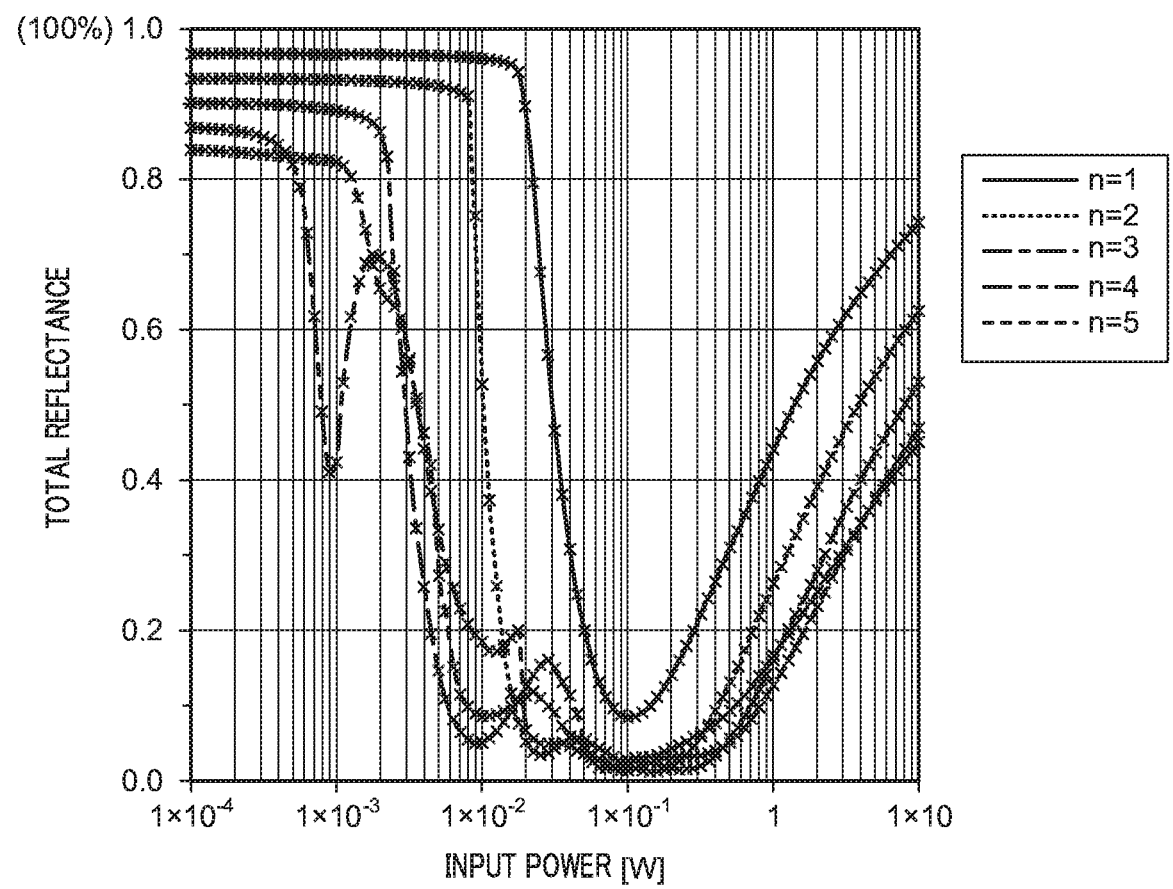
FIG. 11 is a diagram illustrating the results of circuit simulation of the microwave-rectifying circuit according to Embodiment 2.

FIG. 10 and FIG. 11 are diagrams illustrating the results of circuit simulation of microwave-rectifying circuit U according to this embodiment. The circuit simulation in FIG. 10 and FIG. 11 is different from that in FIG. 6 and FIG. 7 only in that phase shifting section 3 is constituted by the π circuits.

As in FIG. 6 and FIG. 7, the graphs in FIG. 10 and FIG. 11 include the graph for n=1 representing the form in which the number of branches is one (no branch), the graph for n=2 representing the form in which the number of branches is two, the graph for n=3 representing the form in which the number of branches is three, the graph for n=4 representing the form in which the number of branches is four, and the graph for n=5 representing the form in which the number of branches is five.

It is found from FIG. 10 and FIG. 11 that, even in the case where phase shifting section 3 is constituted by the π circuits, a high RF/DC conversion efficiency can be attained as in Embodiment 1.

As described above, also with microwave-rectifying circuit U according to this embodiment, it is possible to suppress re-radiation of reflected waves generated in rectifying section 4 from antenna 1 to an external space, and furthermore, to increase the RF/DC conversion efficiency.

The description has been given where the π circuit is used as the lumped constant circuit; however, a T circuit or a multi-stage configuration thereof can be used. The lumped constant circuit is highly reflective for harmonics other than fundamental waves, and the lumped constant circuit itself has a harmonics suppressing effect. Therefore, for harmonics, it is desirable that each of phase shifting sections $3n2, \ldots, 3nn$ is constituted by the lumped constant circuit.

Other Embodiments

The present invention is not limited to the above-described embodiments, and various modifications are possible.

In the above-described embodiments, as an example configuration of microwave-rectifying circuit U, the configuration in which branch lines Ln1, . . . , Lnn have phase shifting section 3 and rectifying section 4 has been illustrated. However, more preferably, it is desirable to further dispose, upstream of rectifying section 4, a filter section (for example, an open stub) that rejects harmonics.

Specific examples of the present invention have been described in detail; however, the specific examples are only examples and are not intended to limit the claims. Techniques described in the claims include various modifications and changes made to the specific examples illustrated above.

The disclosure of Japanese Patent Application No. 2017-165792, filed on Aug. 30, 2017, including the specification, drawings, and abstract, is incorporated herein by reference in its entirety.

INDUSTRIAL APPLICABILITY

With the microwave-rectifying circuit according to the present disclosure, it is possible to suppress re-radiation of a received microwave from the antenna to an external space.

REFERENCE SIGNS LIST

1 Antenna
2 Input line
3 Phase shifting section
4 Rectifying section
L0 Branch point
Ln1, Ln2, Ln3, . . . , Lnn Branch line
U Microwave-rectifying circuit
Vin Input wave

What is claimed is:

1. A microwave-rectifying circuit that rectifies AC signal power, the microwave-rectifying circuit comprising:
an input line to which the AC signal power is input;
1st to nth plurality of branch lines coupled to the input that are n branch lines, wherein n is a positive integer equal to or larger than 3;
1st to nth rectifying sections that are disposed in the 1st to nth branch lines respectively and rectify the AC signal power; and
1st to (n−1)th phase shifting sections that are disposed upstream of the corresponding rectifying sections in at least the 1st to (n−1)th branch lines respectively among the 1st to nth branch lines to shift a phase of the AC signal power,
wherein each of the 1st to (n−1)th phase shifting sections is selected to provide a phase difference between the 1st to (n−1)th phase shifting sections equal to k×180/n°, respectively, wherein the k is an integer from 1 to (n−1), to suppress power reflection of the AC signal power back to the input;
wherein
the 1st to nth rectifying sections are composed of diodes having substantially the same properties respectively such that the power reflection respectively generated in the 1st to nth rectifying sections have substantially the same power reflection, and
in the 1st to nth branch lines, between the branch point and the 1st to nth rectifying sections, no circuit components other than the 1st to (n−1)th phase shifting sections are disposed.

2. The microwave-rectifying circuit according to claim 1, wherein
the AC signal power is input to the input line via an antenna.

3. The microwave-rectifying circuit according to claim 1, wherein
each of the 1st to (n−1)th phase shifting sections is composed of a distributed constant line.

4. The microwave-rectifying circuit according to of claim 1, wherein
each of the 1st to (n−1)th phase shifting sections is composed of a lumped constant circuit.

* * * * *